United States Patent
Epmeier et al.

(10) Patent No.: US 11,821,591 B2
(45) Date of Patent: Nov. 21, 2023

(54) LIGHTING DEVICE COMPRISING SUPPORT STRUCTURE WITH IMPROVED THERMAL AND OPTICAL PROPERTIES

(71) Applicant: Lumileds LLC, San Jose, CA (US)

(72) Inventors: Matthias Epmeier, Aachen (DE); Gennadi Tochadse, Aachen (DE); Bernd Schoenfelder, Aachen (DE); Marcus Jozef Henricus Kessels, Echt (NL); Wilbert Heffels, Middleburg (NL)

(73) Assignee: Lumileds LLC, San Jose, CA (US)

( * ) Notice: Subject to any disclaimer, the term of this patent is extended or adjusted under 35 U.S.C. 154(b) by 0 days.

(21) Appl. No.: 17/919,031

(22) PCT Filed: Apr. 23, 2021

(86) PCT No.: PCT/US2021/028889
§ 371 (c)(1),
(2) Date: Oct. 14, 2022

(87) PCT Pub. No.: WO2021/225804
PCT Pub. Date: Nov. 11, 2021

(65) Prior Publication Data
US 2023/0235862 A1 Jul. 27, 2023

Related U.S. Application Data

(60) Provisional application No. 63/021,315, filed on May 7, 2020.

(30) Foreign Application Priority Data

May 7, 2020 (EP) ..................................... 20173441

(51) Int. Cl.
*F21K 9/237* (2016.01)
*F21V 23/00* (2015.01)
(Continued)

(52) U.S. Cl.
CPC .............. *F21K 9/237* (2016.08); *F21K 9/232* (2016.08); *F21V 23/001* (2013.01); *F21Y 2107/00* (2016.08); *F21Y 2115/10* (2016.08)

(58) Field of Classification Search
CPC ........ F21K 9/237; F21K 9/232; F21V 23/001; F21Y 2107/00; F21Y 2115/10
See application file for complete search history.

(56) References Cited

U.S. PATENT DOCUMENTS

| | | | | |
|---|---|---|---|---|
| 8,653,723 | B2 * | 2/2014 | Cao | F21V 29/67 313/45 |
| 9,664,369 | B2 * | 5/2017 | Richards | F21K 9/232 |
| 2007/0045802 | A1 | 3/2007 | Chen | |

FOREIGN PATENT DOCUMENTS

| | | | |
|---|---|---|---|
| CN | 107845722 | * | 3/2018 |
| CN | 107845722 A | | 3/2018 |

(Continued)

OTHER PUBLICATIONS

CN 107845722, Mar. 27, 2018, Inventors Dong and Mei, English translation (Year: 2018).*

(Continued)

*Primary Examiner* — Peggy A Neils

(57) ABSTRACT

A lighting device (1) is provided comprising a support structure (13, 13'), the support structure (13, 13') comprising a first layer (13a, 13a') comprising metal and a second layer (13b, 13b') comprising metal; a central mounting face (18c) formed by a portion of the first layer (13a, 13a') and by a portion of the second layer (13b, 13b'); and at least one lateral mounting face (18a, 18b) formed by a portion of one of the first layer (13a, 13a') and the second layer (13b, 13b'); the lighting device (1) further comprising: at least one first light emitting element (11.1, 11.2, 11.3, 11.4, 11.5) arranged on the central mounting face (18c) in contact with the first layer (13a, 13a') and in contact with the second layer (13b, (Continued)

13b'); at least one second light emitting element (12a.1, 12a.2, 12a.3, 12a.4, 12a.5, 12b.1) arranged on the lateral mounting face (18a, 18b) in contact with the one of the first layer (13a, 13a') and the second layer (13b, 13b') forming the lateral mounting face (18a, 18b), and separated from the other one of the first layer (13a, 13a') and the second layer (13b, 13b').

Furthermore, a method for manufacturing such lighting device (1) and an automotive headlight comprising such lighting device (1) are provided.

15 Claims, 7 Drawing Sheets

(51) Int. Cl.
*F21K 9/232* (2016.01)
*F21Y 115/10* (2016.01)
*F21Y 107/00* (2016.01)

(56) References Cited

FOREIGN PATENT DOCUMENTS

| WO | WO2009037645 | * | 3/2009 |
|---|---|---|---|
| WO | 2020/048766 A1 | | 3/2020 |

OTHER PUBLICATIONS

From the EPO as the ISA, Notification of Transmittal of the International Search Report and the Written Opinion of the International Searching Authority, or the Declaration, PCT/US2021/028889, dated Jun. 9, 2021, 11 pages.

The extended European search report, EP20173441.5, dated Oct. 16, 2020, 8 pages.

* cited by examiner

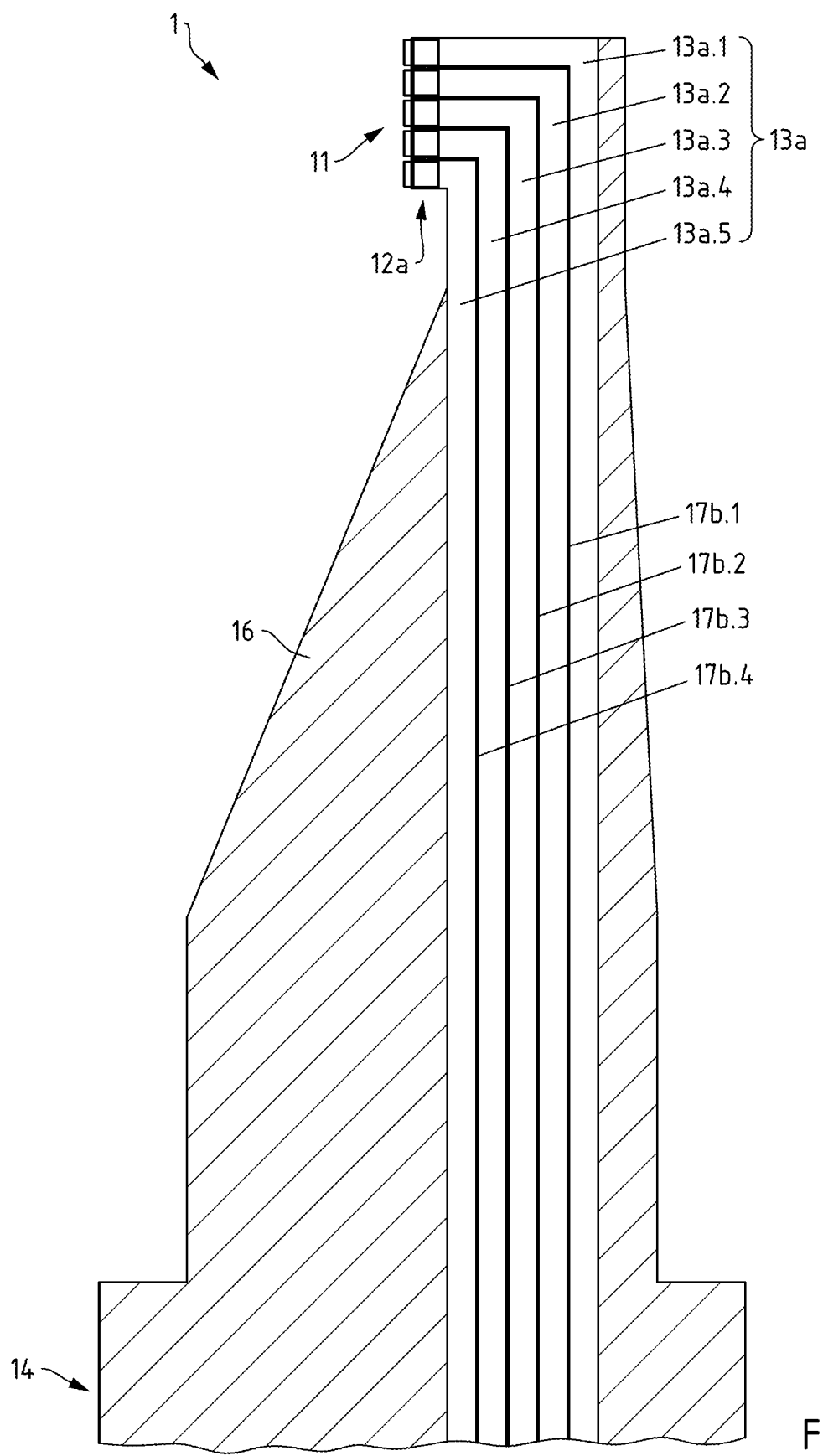

LIGHTING DEVICE COMPRISING SUPPORT STRUCTURE WITH IMPROVED THERMAL AND OPTICAL PROPERTIES

CROSS REFERENCE TO RELATED APPLICATIONS

This application is a 371 national phase entry of International Application No. PCT/US2021/028889 filed Apr. 23, 2021 which claims benefit of priority to U.S. Application No. 63/021,315 filed May 7, 2020, and to European Patent Application 20173441.5 filed May 7, 2020, each of which is incorporated herein by reference in its entirety.

FIELD OF THE INVENTION

The present disclosure relates to a lighting device comprising a support structure with a central mounting face for at least one first light emitting element and at least one lateral mounting face for at least one second light emitting element such that the lighting device may suitably be employed as retrofit mimicking a halogen lamp e.g. for an automotive headlight. The disclosure further relates to a method of manufacturing the lighting device and to an automotive headlight with such lighting device.

BACKGROUND OF THE INVENTION

Lighting devices such as halogen lamps have been standard light sources for automotive headlights for many years. However, recent advances in LED technology with concomitant new design possibilities and energy efficiency has spurred interest in finding suitable replacements for halogen lamps based on LED technology, such replacement being often referred to as LED retrofit.

While LED retrofits have become popular in recent years, capabilities of LED retrofits in mimicking halogen lamps are not yet optimal. For example, differing geometries of light emission regions of halogen lamps (filament) and e.g. LED dies (light emission surfaces) may cause difficulties when LED dies are used for mimicking the light emission of a halogen lamp not only in the near field but also in the far field.

SUMMARY OF THE INVENTION

In one approach, existing LED retrofits comprise a PCB (Printed Circuit Board) based support structure where LEDs are arranged on opposing sides of a PCB. While such approach may already provide satisfactory results for certain applications, a further improved solution is necessary to achieve in particular a light intensity distribution mimicking a corresponding light intensity distribution of a halogen lamp that meets requirements e.g. for automotive applications such as headlight applications. At the same time, it is desirable to provide a solution that enables coping with large heat densities to be expected from LEDs mimicking halogen lamps, in particular in automotive headlight applications.

It is thus an object of the present invention to provide a lighting device with improved capability to mimic light emission properties of a conventional halogen lamp. It is a further object of the present invention to provide a lighting device with improved capability to cope with large heat densities. It is yet a further object of the invention to provide a method of manufacturing the lighting device.

According to a first aspect of the present invention, a lighting device is provided, the lighting device comprising a support structure, the support structure comprising a first layer comprising metal and a second layer comprising metal; a central mounting face formed by a portion of the first layer and by a portion of the second layer; and at least one lateral mounting face formed by a portion of one of the first layer and the second layer; the lighting device further comprising at least one first light emitting element arranged on the central mounting face in contact with the first layer and in contact with the second layer; and at least one second light emitting element arranged on the lateral mounting face in contact with the one of the first layer and the second layer forming the lateral mounting face, and separated from the other one of the first layer and the second layer.

According to a second aspect of the present invention, a method of manufacturing a lighting device, in particular the lighting device according to the first aspect, is provided, the method comprising providing a support structure, wherein providing the support structure comprises providing a first layer comprising metal, providing a second layer comprising metal; forming a central mounting face by a portion of the first layer and by a portion of the second layer; forming at least one lateral mounting face by a portion of one of the first layer and the second layer; the method further comprising: arranging at least one first light emitting element on the central mounting face in contact with the first layer and in contact with the second layer; arranging at least one second light emitting element on the lateral mounting face in contact with the one of the first layer and the second layer forming the lateral mounting face, and separated from the other one of the first layer and the second layer.

According to a third aspect of the present invention, an automotive headlight is provided comprising the lighting device according to the first aspect.

Exemplary embodiments of the first, the second and the third aspects of the invention may have one or more of the properties described below.

In an exemplary embodiment, the support structure comprises a first and a second layer comprising or essentially consisting of a metallic material such as a metal, a metal mixture or alloy, having good electrical and thermal conductivity properties such as copper and/or aluminum. Thereby, essentially consisting of is to be understood as consisting predominantly of such metal (e.g. at least 90%) and possibly including further materials such as impurities or the like.

In an exemplary embodiment, the support structure is formed by two essentially planar layers (which may be bent one or more times in accordance with an application) arranged parallel and adjacent to each other and being separated by an insulating layer comprising e.g. a dielectric insulating material. Using a dielectric insulating material is beneficial e.g. in terms of corresponding properties to withstand and to conduct heat.

The central mounting face is formed by respective portions of the first layer and the second layer, in particular by respective edge portions. For example, the first and the second layer may be formed by one double sided or two single sided metal core boards, such as insulated metal substrates (IMS), and the central mounting face corresponds in this case to an edge of the one double sided IMS or to respective adjacent edges of the two single sided IMSs. It is noted that more than two IMSs (metal core boards) may be employed if required by the application. For example, a single sided or double sided IMS sandwiched between two outer IMSs may allow for additional connections if necessary. Alternatively or in addition, two or more IMSs may be arranged adjacent to form the first and/or the second layer.

The at least one lateral mounting face is formed by a portion of one of the first layer and the second layer. In other words, the at least one lateral mounting face is formed by a portion of the first layer or by a portion of the second layer. In an exemplary embodiment, the at least one lateral mounting face is formed by a portion of one of the first layer and the second layer adjacent to the central mounting face, in particular forming an angle of 90°±5° with the central mounting face.

Thus, as for example opposed to conventional LED retrofits, by providing the central mounting face, in particular at an edge portion of the support structure, and the corresponding at least one lateral mounting face, respective mounting faces for mounting the at least one first and the at least one second light emitting elements are provided for advantageously mimicking a filament of a conventional halogen lamp. In particular providing the central mounting face in addition to one or two lateral mounting faces advantageously enables mimicking not only the near field of a conventional halogen lamp but in addition also the far field. In this way, it becomes possible to meet requirements for near and far field intensity distributions that exist in particular in the automotive field such that the lighting device according to the first aspect may advantageously be employed as light source for an automotive headlight. At the same time, while being highly advantageous for such application, the lighting device according to the first aspect may be suitably employed as light source also in different applications, e.g. in flashlight applications, projector applications, etc.

The lighting device further comprises at least one first light emitting element arranged on the central mounting face in contact with the first layer and in contact with the second layer. Thereby, in an exemplary embodiment, the at least one first light emitting element is in mechanical, electrical and/or thermal contact with the metal of the central mounting face. The lighting device further comprises at least one second light emitting element arranged on the lateral mounting face in contact with the one of the first layer and the second layer forming the lateral mounting face, and separated from the other one of the first layer and the second layer. Thereby, in an exemplary embodiment, the at least one second light emitting element is in mechanical, electrical and/or thermal contact with the metal of the lateral mounting face. In an exemplary embodiment, the at least one first light emitting element and/or the at least one second light emitting element is a light emitting diode (LED), in particular an LED die. Employing LEDs is advantageous in terms of efficiency (light output power vs. electrical power consumption) and in that for example a light color can be suitably chosen for a particular application.

In an exemplary embodiment, the support structure further comprises an electrically insulating layer separating the first layer and the second layer. The insulating layer may for example be an insulating layer sandwiched by the first and the second layer, i.e. may be arranged in direct contact with the first and with the second layer in between the first and the second layer. In an exemplary embodiment, the insulating layer comprises or consists of a dielectric material which is advantageous in terms of properties to withstand and to transport heat. Suitable materials may include e.g. highly conductive dielectric materials like PrePreg with suitable particles, phase change sheets or resin coated copper (RCC).

By providing the support structure formed by the first and the second layers sandwiching the insulating layer, an advantageously compact and solid structure can be provided for supporting and electrically contacting light emitting elements of a lighting device, which advantageously allows incorporating the lighting device in particular as light source into an automotive headlight. In addition, it turned out that providing a sandwich structure of the first and second layers (in particular comprising a metal such as copper) and of the dielectric insulating layer enables an improved thermal management and enhanced heat flow guiding heat generated by light emitting elements away.

In an exemplary embodiment, each of the first and the second layers comprises at least two, in particular adjacent, conductor segments and at least one corresponding insulating segment separating the at least two conductor segments. Thus, the first and the second layer may for example respectively correspond to a metal sheet, e.g. a copper sheet, cut into respective segments for example using a thin laser beam, the segments being attached (e.g. glued) to the insulating layer to form the respective first and second layers. In an alternative example, the first layer and the second layer may correspond to respective sides of a double sided IMS or each of the first layer and the second layer may respectively correspond to a corresponding single sided IMS, whereby in such example, the conductive segments may correspond to respective conductors of the double sided or the single sided IMSs. By segmenting each layer into the conductor segments, each layer may be employed for electrically contacting one or more light emitting elements such that respective longitudinal arrangements of light emitting elements may be arranged on the central and/or lateral mounting faces and may be respectively contacted for mimicking e.g. a filament of a halogen lamp. It turned out that a support structure configured in this way is in particular advantageous in enabling transport of heat generated by individual light emitting elements away via corresponding conductor segments corresponding to the individual light emitting elements.

In an exemplary embodiment, the first light emitting element is arranged in electrical contact, and in particular in mechanical contact, with at least one conductor segment of the first layer and with at least one conductor segment of the second layer. Thus, the first and second layers may be used e.g. for contacting first light emitting elements arranged on the central mounting face at respective polarities. Thus, in an exemplary embodiment, at least two first light emitting elements arranged on the central mounting face are connected in parallel with an electrical power source. While such parallel connection of first light elements arranged at the central mounting face may on the one hand be advantageous in terms of connection simplicity, it is noted on the other hand that by suitably taking advantage of individual contact segments comprised by the first and second layers, it is also possible to individually control individual first light emitting elements arranged on the central mounting face.

In an exemplary embodiment, the second light emitting element is arranged in electrical contact, and in particular in mechanical contact, in particular only, with the one of the first layer and the second layer forming the lateral mounting face, and is arranged electrically insulated from the at least one conductor segment of the other one of the first and the second layer. It is noted that being electrically insulated from the at least one conductor segment of the other one of the first and the second layer, the at least one second light emitting element may be not in any direct contact with this layer. In other words, the at least one second contact element is electrically connected (and arranged in mechanical contact) only with one or more conductor segments of the first or of the second layer.

In an exemplary embodiment, each of the at least two conductor segments (of each of the first and the second layer) comprises an L-shaped portion with a first leg, a second leg and a bent portion between the first leg and the second leg, wherein the first leg is shorter than the second leg. Thereby, the first leg is connected to the second leg via the bent portion to form the L-shape. It is noted that forming an L-shaped portion, in an exemplary embodiment, the first leg is arranged at an angle of 90°±20°, in particular ±10°, in particular ±5°, with respect to the second leg. For example, in case that the first and second layers respectively correspond to metal sheets as mentioned above, the conductor segments may be cut from the metal sheets employing an L-shaped cut. In case that the first and second layers correspond to one or more IMSs, corresponding conductors of the IMSs may be L-shaped.

In an exemplary embodiment, the central mounting face is formed by respective end portions of respective first legs of the at least two conductor segments of the first layer and by respective end portions of respective first legs of the at least two conductor segments of the second layer. Thus, in an exemplary embodiment, the first leg of a respective conductor segment is (mechanically and electrically) connected to a respective first or second light emitting element. The at least one first light emitting element is thus in electrical and mechanical contact with a conductor segment of the first layer and with a conductor segment of the second layer. In an exemplary embodiment, the at least one lateral mounting face is formed by respective lateral faces of respective first legs of the at least two conductor segments of the one of the first layer and the second layer forming the lateral mounting face. Thus, the at least one second light emitting element is in mechanical and electrical contact only with first legs of conductor segments of the first or of the second layer. Such L-shape turned out to be advantageous for mimicking a filament of a halogen lamp as it facilitates exposing e.g. one or more linear arrangements of light emitting elements arranged on the respective mounting faces mimicking a position of a filament of a halogen lamp.

In an exemplary embodiment, the lighting device comprises a first lateral mounting face formed by a portion of the first layer and a second lateral mounting face formed by a portion of the second layer, wherein each of the first and the second lateral mounting faces is arranged adjacent to the central mounting face forming an angle with the central mounting face. In other words, light emitting elements are arranged on three different adjacent faces of the support structure and are thus advantageously arranged for mimicking a three-dimensional structure of a filament. Being arranged in this way, the light emitting elements are not only arranged beneficially for mimicking the filament near field but in addition also its far field. In an exemplary embodiment, the first and the second lateral mounting faces are arranged mutually opposing and forming an angle of 90°±5° with the central mounting face. By arranging more than one light emitting element on each of the central and the two lateral mounting faces along a common mounting direction, a three-dimensional arrangement of light emitting elements is achieved which is optimized for mimicking such filament. Thus, in an exemplary embodiment, the central mounting face, the first lateral mounting face and the second lateral mounting face are faces of a longitudinal mounting section forming a protruding part of the support structure. Further, in an exemplary embodiment, the lighting device comprises a central arrangement of at least two first light emitting elements (e.g. 3, 4, 5, 6, 7, 8, 9, 10 light emitting elements) arranged along a mounting direction on the central mounting face, a lateral arrangement of at least two second light emitting elements arranged along the mounting direction on the first lateral mounting face and a lateral arrangement of at least two second light emitting elements arranged along the mounting direction on the second lateral mounting face.

In an exemplary embodiment, the support structure comprises one metal core board, in particular an insulated metal substrate, forming the first and the second layer or two metal core boards, in particular two insulated metal substrates, respectively forming the first and the second layer. In other words, each of the first and the second layer may correspond e.g. to a single sided metal core board or both the first and the second layer may correspond to respective sides of a single double sided metal core board. In an exemplary embodiment, the metal core board is an insulated metal substrate (IMS) board. An IMS board comprises a thin layer of an electrically conductive material (e.g. copper) on a dielectric layer (e.g. thermally activated epoxy resin, highly conductive dielectric materials like PrePreg with suitable particles, phase change sheets or resin coated copper (RCC)), laminated on a thicker base layer of an electrically conductive material (e.g. aluminum or copper). The thin layer and/or the base layer of an IMS may correspond to the first layer and/or to the second layer. Use of metal core boards turned out to be advantageous in that it enables providing a compact and solid support structure with highly beneficial heat transport properties.

In an exemplary embodiment, the lighting device according to the first aspect is a light source, e.g. a lamp, for example configured to be mounted to a lighting system, in particular to an automotive headlight. Different lighting systems include for example projector systems, flashlights, reflector and/or projector systems. In a vehicular context, typical applications include low beam, high beam, fog, and/or DRL applications. Being configured in this way, the lighting device may further comprise e.g. a suitable socket for mounting the lighting device to such lighting system.

The features and example embodiments of the invention described above may equally pertain to the different aspects according to the present invention. In particular, with the disclosure of features relating to the lighting device according to the first aspect, also corresponding features relating to the method according to the second aspect or to the automotive headlight according to the third aspect are disclosed.

It is to be understood that the presentation of embodiments of the invention in this section is merely exemplary and non-limiting.

Other features of the present invention will become apparent from the following detailed description considered in conjunction with the accompanying drawings. It is to be understood, however, that the drawings are designed solely for purposes of illustration and not as a definition of the limits of the invention, for which reference should be made to the appended claims. It should be further understood that the drawings are not drawn to scale and are merely intended to conceptually illustrate the structures and procedures described herein.

BRIEF DESCRIPTION OF THE DRAWINGS

Examples of the invention will now be described in detail with reference to the accompanying drawings, in which:

FIG. 2B illustrates a cross-sectional view of the lighting device of FIG. 2A;

DETAILED DESCRIPTION OF THE EMBODIMENTS

Figure 1:
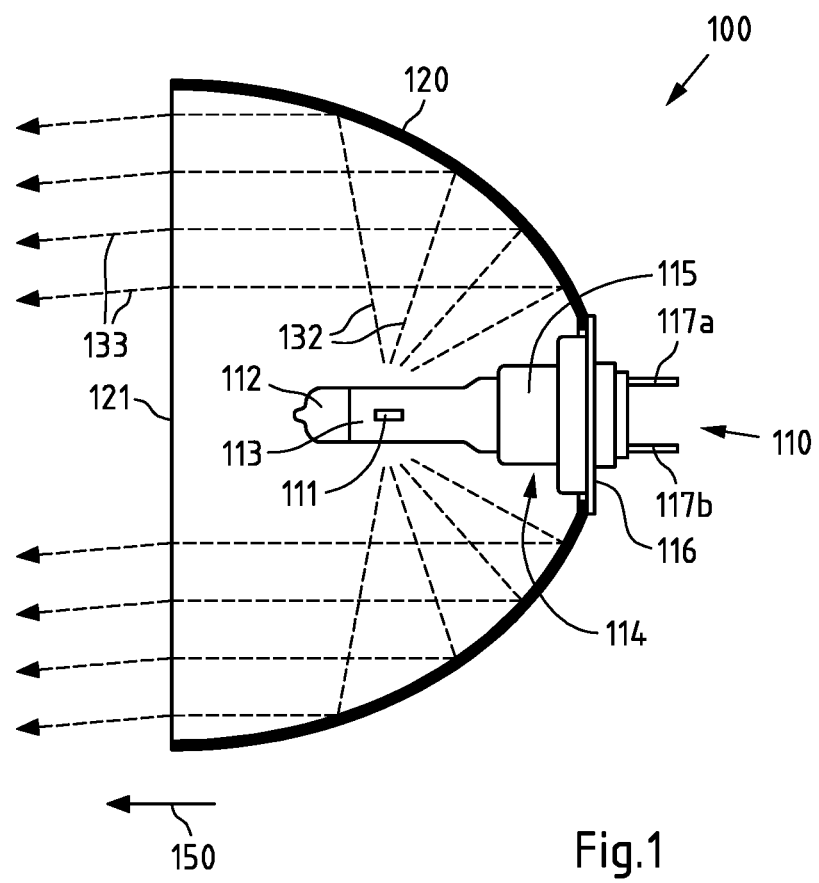
FIG. 1 exemplarily illustrates a headlight with a conventional halogen lamp.

FIG. 1 shows a headlight 100 with a reflector 120 to which an exemplary conventional H7 halogen lamp 110 is mounted. A filament 111 of halogen lamp 110 is placed at a focus of reflector 120 such that light 132 emitted from filament 111 is reflected by the reflector 120 along a main lighting direction 150. A cover 121 may incorporate suitable optics for shaping the reflected light and to form light 133 leaving headlight 100. Lamp 110 comprises a socket 114 mounted to reflector 120 via mounting portion 116. Pins 117a and 117b extend from socket 114 for power connection. Bulb 113 extends from base portion 115 surrounding filament 111 and ends in a light blocking portion 112 which blocks direct light from filament 111.

Figure 2A:
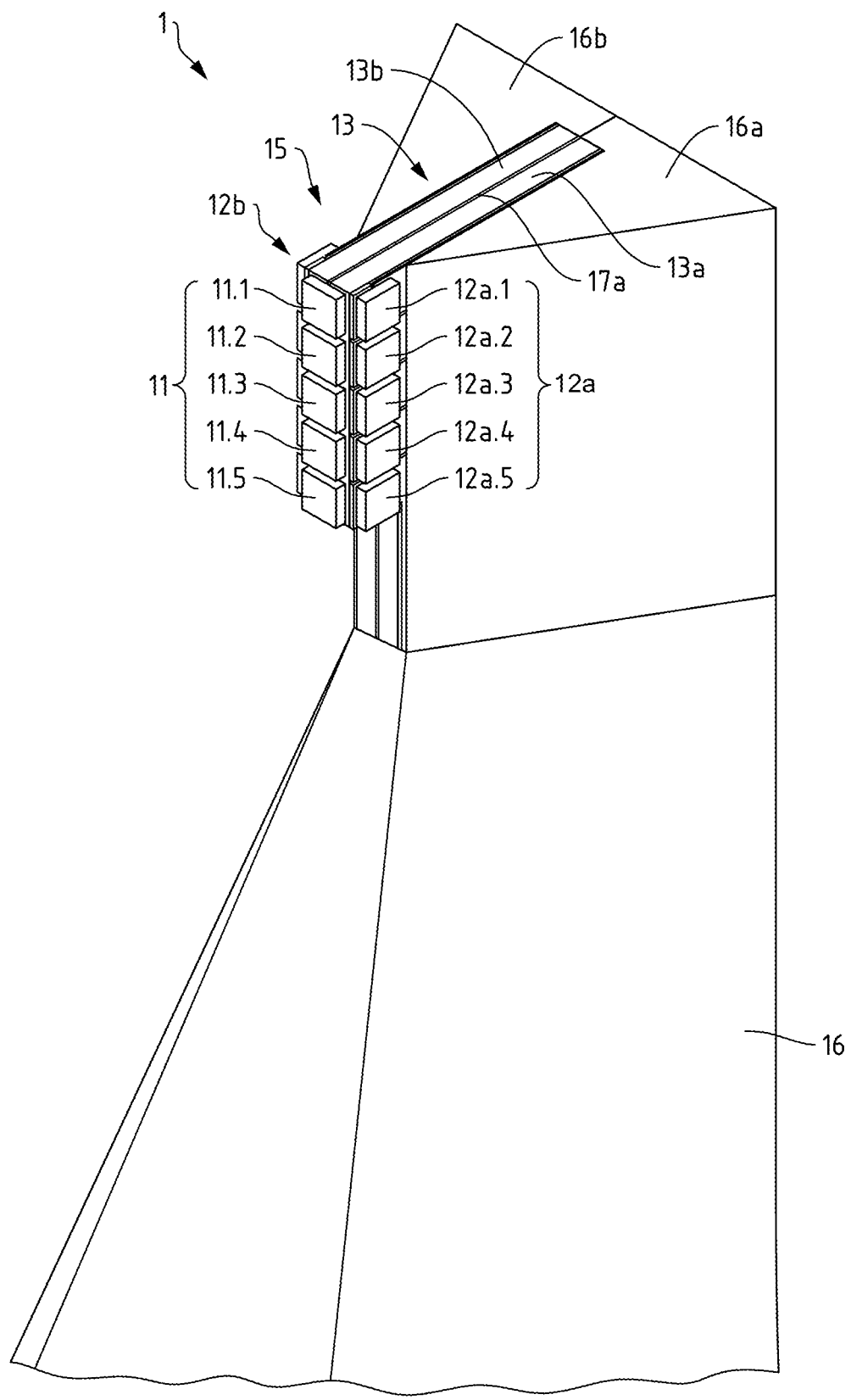
FIG. 2A exemplarily illustrates a lighting device according to an embodiment of the invention.

FIGS. 2A and 2B show an exemplary lighting device 1 according to an exemplary embodiment of the invention. Thereby, FIG. 2A shows a three-dimensional view of part of the lighting device 1 and FIG. 2B shows a cross-sectional side view onto a first layer 13a. The lighting device 1 is an LED retrofit comprising a base portion 16 which may be connected to a corresponding automotive headlight (not shown) via socket 14 (FIG. 2B). Replacing bulb 113 and filament 111 of FIG. 1, lighting device 1 comprises a support structure 13 and arrangements 11, 12a and 12b of light emitting diodes (LEDs) which are examples of light emitting elements. As can be taken from FIG. 2A, support structure 13 is inserted in between sections 16a and 16b of base portion 16 and is formed by a first layer 13a and a second layer 13b separated by an insulating layer 17a. A longitudinal mounting section 15 protrudes from support structure 13 comprising a central mounting face 18c (see FIG. 3A). A central arrangement 11 of LEDs 11.1, 11.2, 11.3, 11.4, and 11.5 (examples of first light emitting elements) is linearly arranged along a mounting direction on the central mounting face 18c. Mounting section 15 further comprises mutually opposing lateral mounting faces 18a and 18b (see FIG. 3A), which are arranged adjacent to and at an angle (of 90°±5°) with the central mounting face 18c. A lateral arrangement 12a of LEDs 12a.1, 12a.2, 12a.3, 12a.4 and 12a.5 (examples of second light emitting elements) is provided along the mounting direction on lateral mounting face 18a. A corresponding lateral arrangement of LEDs provided on the opposing lateral mounting face 18c is not visible in FIGS. 2A and 2B due to the perspective. Thus, a filament of a halogen lamp, such as filament 111 in FIG. 1, can be advantageously mimicked by arranging the LEDs on the corresponding central and lateral mounting faces of support structure 13 as shown in FIG. 2A.

As shown in FIG. 2B, the first layer 13a comprises conductor segments 13a.1, 13a.2, 13a.3, 13a.4 and 13a.5 being mutually insulated by insulating segments 17b.1, 17b.2, 17b.3 and 17b.4 and respectively corresponding e.g. to first lighting elements 11.1, 11.2, 11.3, 11.4 and 11.5. The second layer 13b comprises corresponding conductor segments which are not visible in the figure due to the perspective. As can further be taken from FIG. 2B, each of the conductor segments comprises an L-shaped portion with respective first legs being perpendicular to a mounting direction e.g. of the first lighting elements 11.1, 11.2, 11.3, 11.4 and 11.5 (and to the corresponding mounting face 18c) and with respective second legs being parallel to the mounting direction (and to the corresponding mounting face). The first and second legs are mutually connected by a bent section where the respective conductor portions are bent forming an angle of essentially 90° (i.e. 90°±5°).

Figure 3A:
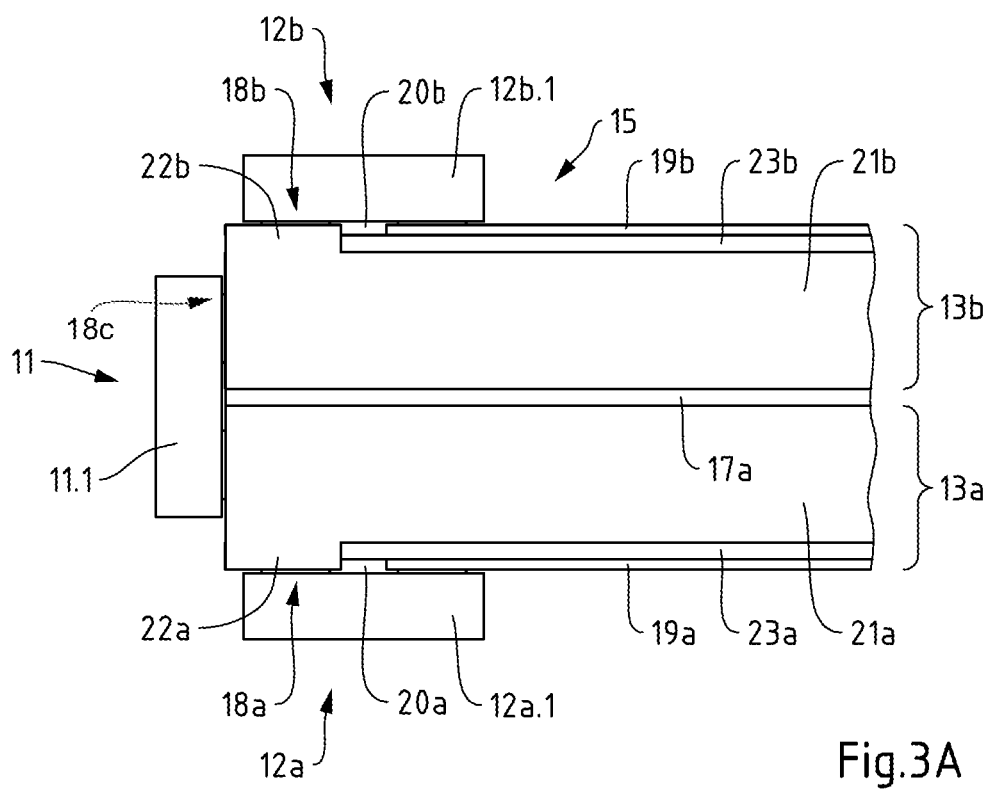
FIG. 3A illustrates a top view of a mounting section of the lighting device of FIG. 2A.
Figure 3B:
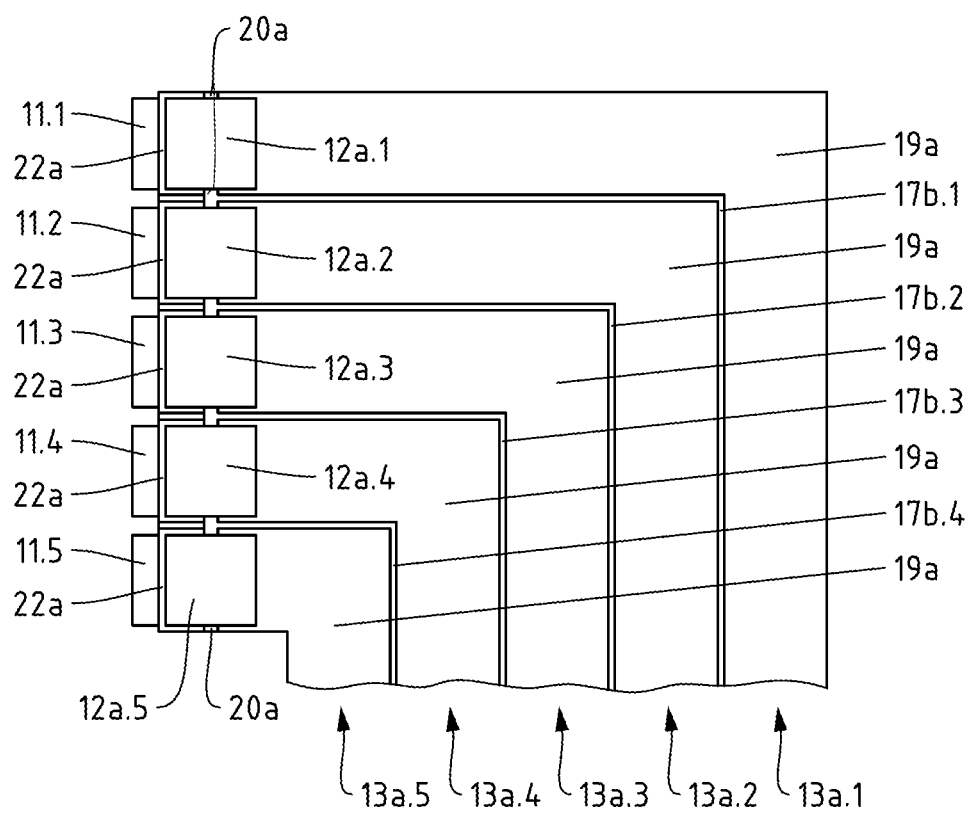
FIG. 3B illustrates a side view of a mounting section of the lighting device of FIG. 2A.

FIGS. 3A and 3B show mounting section 15 of the lighting device 1 of FIGS. 2A and 2B in more detail. FIG. 3A shows a top view onto the first layer 13a and the second layer 13b (onto conductor segments 13a.1 and 13b.1) and FIG. 3B shows a side view of support structure 13 corresponding to the side view of FIG. 2B. As shown, the first layer 13a corresponds to a single sided Insulating Metal Substrate (IMS) board comprising a metallic base layer 21a, a dielectric insulating layer 23a and a thin contact layer 19a. Accordingly, the second layer 13b corresponds to a single sided IMS board comprising a metallic base layer 21b, a dielectric insulating layer 23b and a contact layer 19b. As exemplarily shown for LED 11.1, LEDs of the central arrangement 11 are in mechanical and electrical contact with the first layer 13a and with the second layer 13b such that on the one hand, the LEDs of central arrangement 11 can be electrically controlled, and on the other hand, heat generated by the LEDs of arrangement 11 is beneficially guided away by the thick base portions (layers 13a and 13b) of the respective IMS boards.

Further, as shown for second lighting element 12a.1, LEDs of the lateral arrangement 12a are in mechanical and electrical contact with the metallic base portion 21a of the first layer 13a via a respective contact portion 22a (which may be referred to as pedestal) and are in mechanical and electrical contact with the thin contact layer 19a separated from the contact portion 22a by an air gap 20a. Similarly, as shown for second lighting element 12b.1, LEDs of the lateral arrangement 12b are in mechanical and electrical contact with the metallic base portion 21b of the second layer 13b via a respective contact portion 22b (a further pedestal) and are in mechanical and electrical contact with the thin contact layer 19b separated from the contact portion 22b by an air gap 20b. It is noted that air gaps 20a and 20b may be filled with an insulating material.

As a result of this construction, LEDs of the lateral arrangements 12a and 12b are advantageously in mechanical contact with the thicker base portions (first and second layers) 13a and 13b via the above mentioned pedestals such that beneficial heat transport is enabled also for the lateral arrangements 12a and 12b. Thereby, on the one hand, every LED of the central and lateral arrangements 11, 12a and 12b is connected to an efficient heat conductor for efficiently guiding away generated heat. On the other hand, a beneficially compact design is provided by sharing the first layer 13a between the central arrangement 11 and the lateral arrangement 12a and by sharing the second layer 13b between the central arrangement 11 and the lateral arrangement 12b.

As can further be taken from FIG. 3A, providing the thin contact layers 19a and 19b and contact portions 22a and 22b enables three corresponding LEDs of the central and the lateral arrangements, e.g. LEDs 12a.1, 11.1 and 12b.1, LEDs 12a.2, 11.2 and 12b.2, LEDs 12a.3, 11.3 and 12b.3, LEDs 12a.4, 11.4 and 12b.4, or LEDs 12a.5, 11.5 and 12b.5 to be connected in series which allows employing an advantageously simple controller for controlling operation of the LEDs.

FIG. 3B illustrates the segments forming the first and second layers in more detail. As can be taken from FIG. 3B, the structure shown in FIG. 3A is repeated for each segment. In other words, an air gap 20a, a contact portion 22a, a thin contact layer 19a, a dielectric insulating layer 23a, a metallic base layer 21a is provided for each conductor segment of the first layer 13a and a corresponding structure is provided also for the second layer 13b (not visible due to the perspective of FIG. 3B).

Figure 4A:
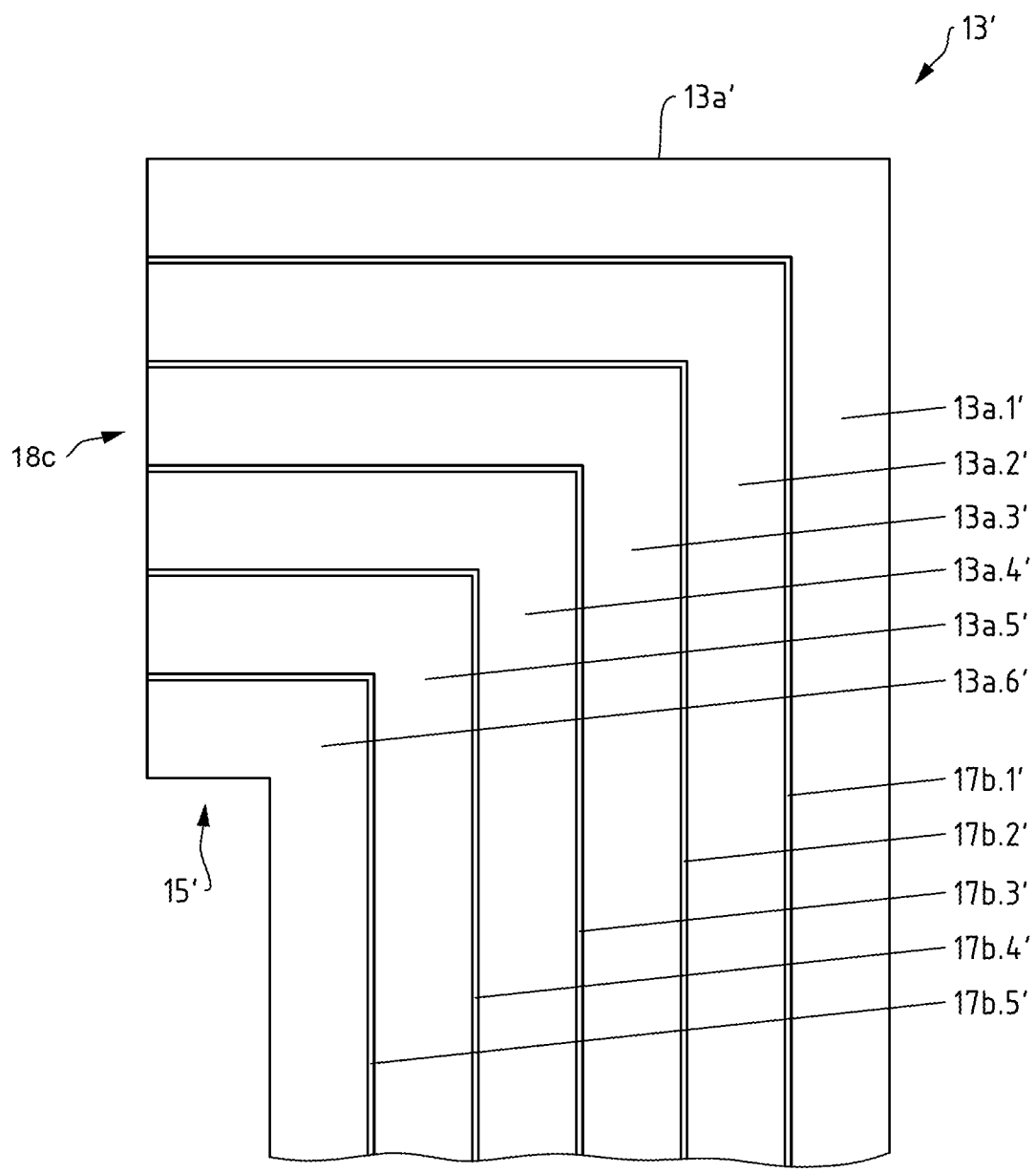
FIG. 4A illustrates a support structure of a lighting device according to a further embodiment.
Figure 4B:
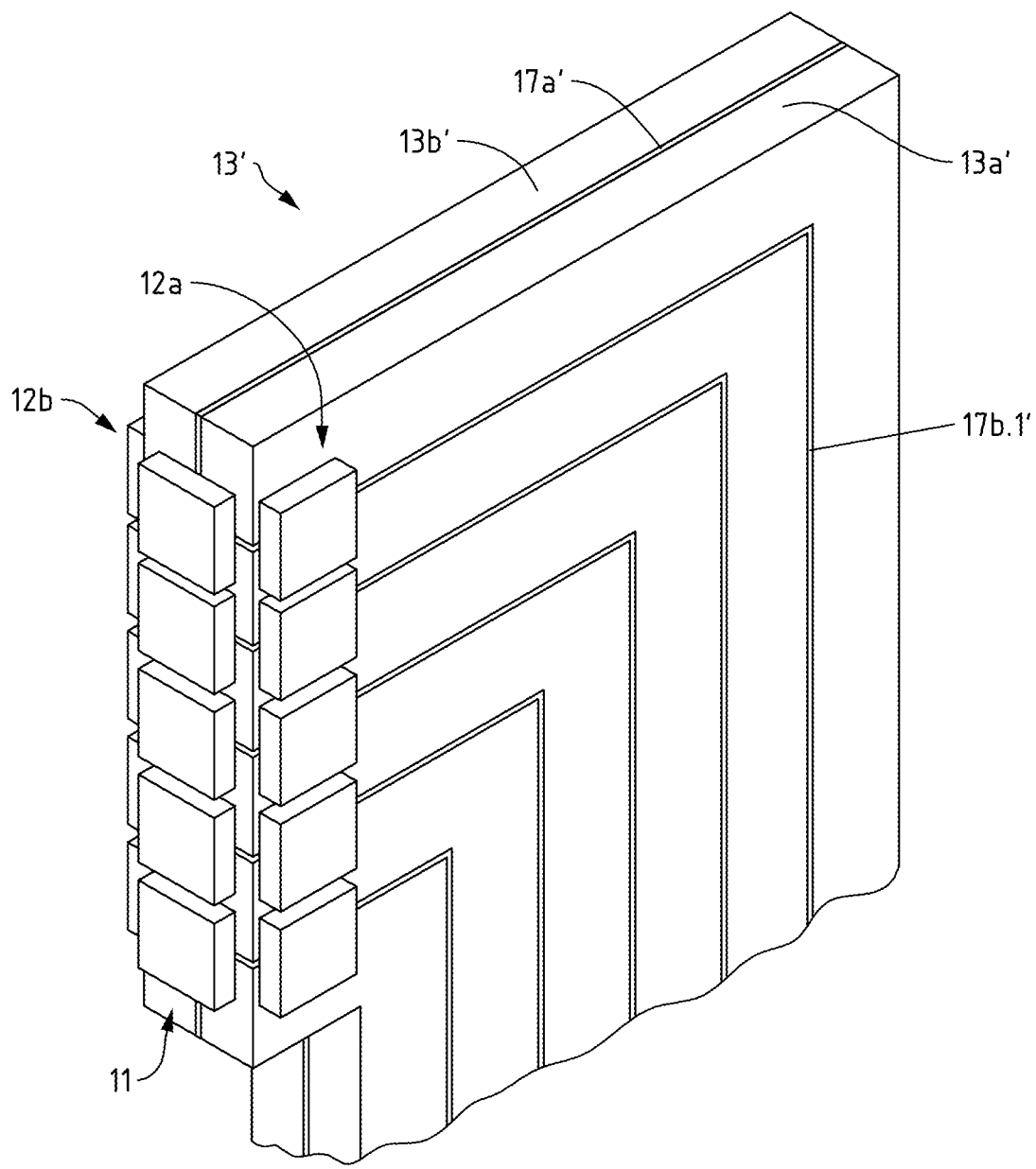
FIG. 4B illustrates the support structure of the lighting device of FIG. 4A and corresponding light emitting elements.
Figure 4C:
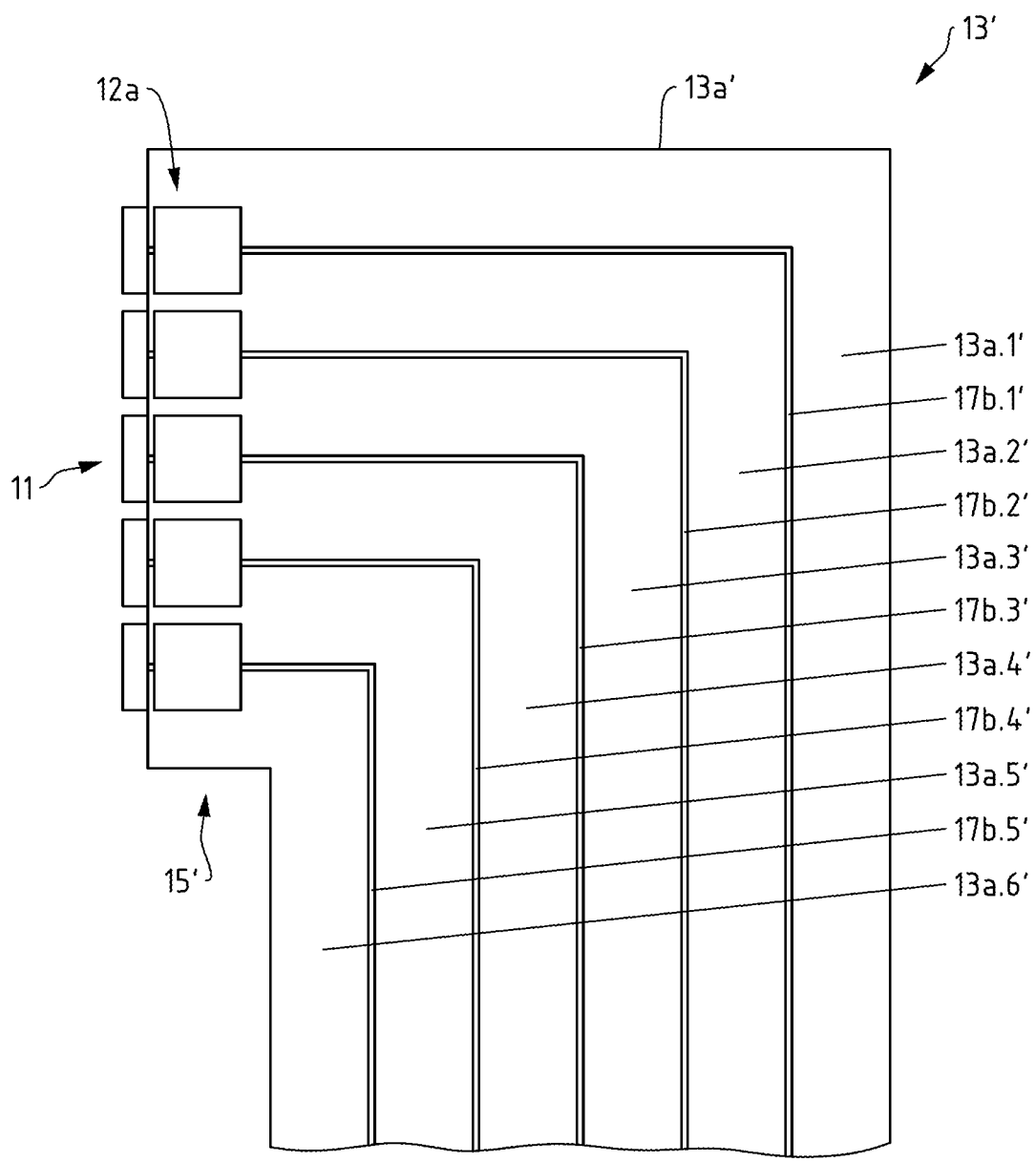
FIG. 4C illustrates the support structure and the light emitting elements of FIG. 4B in a different view.

FIGS. 4A, 4B and 4C illustrate a further embodiment of support structure 13' comprising a first layer 13a' and a second layer 13b' (see FIG. 4B). Each of the first layer 13a' and the second layer 13b' correspond in this embodiment to a copper plate (thickness ~400 μm) structured into respective conductor segments. For example, as can be taken from FIG. 4A, the first layer 13a' is structured, e.g. using a laser, into individual slits or segments 13a.1', 13a.2', 13a.3', 13a.4', 13a.5' and 13a.6' separated by respective insulating air gaps (insulating segments) 17b.1', 17b.2', 17b.3', 17b.4' and 17b.5' which may be filled with an insulating material. As visible in FIG. 4B, the first layer 13a' and the second layer 13b' are mutually insulated by insulating layer 17a', e.g. a layer of a dielectric material. Similar to the case illustrated in FIGS. 2A and 2B a longitudinal mounting section 15' is formed as protruding part of support structure 13' comprising a central mounting face 18c. A central arrangement 11 of LEDs is linearly arranged along a mounting direction on central mounting face 18c (FIG. 4B). Mounting section 15' further comprises mutually opposing lateral mounting faces, which are arranged adjacent to and at an angle (of essentially 90°) with the central mounting face 18c. Lateral arrangements 12a and 12b of LEDs are provided along the mounting direction on the lateral mounting faces (FIG. 4B). As in case of FIGS. 2A and 2B, LEDs of the central arrangement 11 are in mechanical and electrical contact with the first layer 13a' and with the second layer 13b'. Further, LEDs of the lateral arrangement 12a are only in mechanical and electrical contact with the first layer 13a' and LEDs of the lateral arrangement 12b are only in mechanical and electrical contact with the second layer 13b'. In case of the second embodiment, each LED of the lateral arrangements 12a, 12b is in contact with a pair of conductor segments for electrical connection (FIG. 4C). In the shown case, five light emitting LEDs on each of the lateral mounting faces and on the central mounting face are electrically connected in series which advantageously enables use of simple control electronics for operating the lighting device.

LIST OF REFERENCE SIGNS

Lighting device 1
First light emitting elements 11.1, 11.2, 11.3, 11.4, 11.5
Second light emitting elements 12a.1, 12a.2, 12a.3, 12a.4, 12a.5, 12b.1
Central arrangement of light emitting elements 11
Lateral arrangements of light emitting elements 12a, 12b
Support structure 13, 13'
First layer 13a, 13a'
Second layer 13b, 13b'
Conductor segments 13a.1, 13a.2, 13a.3, 13a.4, 13a.5, 13a.1', 13a.2', 13a.3', 13a.4', 13a.5', 13a.6'
Socket 14
Mounting section 15, 15'
Base portion 16
Sections 16a, 16b
Insulating layer 17a, 17a'
Insulating segments 17b.1, 17b.2, 17b.3, 17b.4, 17b.1', 17b.2', 17b.3', 17b.4', 17b.5'
Mounting faces 18a, 18b, 18c
Thin contact layers 19a, 19b
Air gaps 20a, 20b
Base portions 21a, 21b
Contact portions 22a, 22b
Insulating layers 23a, 23b
Headlight 100
Halogen lamp 110
Filament 111
Light blocking portion 112
Bulb 113
Socket 114
Base portion 115
Mounting portion 116
Pins 117a, 117b
Reflector 120
Cover 121
Light rays 132, 133
Main lighting direction 150

The invention claimed is:

1. A lighting device comprising:
a support structure comprising:
a plurality of conductor segments organized into a first layer and a second layer, the first and second layers each comprising at least two conductor segments, each conductor segment electrically insulated from other conductor segments;
a central mounting face formed by a portion of each of the plurality of conductor segments; and
at least one lateral mounting face formed by a portion of each of the conductor segments of the first layer;
a plurality of first light emitting elements arranged on the central mounting face; each of the first light emitting elements in contact with one conductor segment from the first layer and one conductor segment from the second layer, each first light emitting element contacting a conductor segment different from a conductor segment contacted by other first light emitting elements; and
a plurality of second light emitting elements arranged on the lateral mounting face; each of the second light emitting elements in contact with one conductor segment from the first layer; each second light emitting element contacting a conductor segment different from a conductor segment contacted by other second light emitting elements.

2. The lighting device according to claim 1, wherein the second light emitting elements are electrically insulated from the conductor segments of the second layer.

3. The lighting device according to claim 1, wherein each of the conductor segments comprises an L-shaped portion with a first leg, a second leg and a bent portion between the first leg and the second leg, wherein the first leg is shorter than the second leg.

4. The lighting device according to claim 3, wherein the central mounting face is formed by respective end portions of respective first legs of the conductor segments of the first layer and by respective end portions of respective first legs of the conductor segments of the second layer.

5. The lighting device according to claim 3, wherein the at least one lateral mounting face is formed by respective lateral faces of respective first legs of the conductor segments of the one of the first layer.

6. The lighting device according to claim 1, comprising a second lateral mounting face formed by a portion of the conductor segments from the second layer, wherein each of the first and the second lateral mounting faces is arranged adjacent to the central mounting face forming an angle with the central mounting face.

7. The lighting device according to claim 6, wherein the lateral mounting faces are arranged mutually opposing and forming an angle of 90°±5° with the central mounting face.

8. The lighting device according to claim 6, wherein the central mounting face, the lateral mounting faces are faces of a longitudinal mounting section forming a protruding part of the support structure.

9. The lighting device according to claim 6, wherein the first light emitting elements are arranged along a mounting direction on the central mounting face, the two second light emitting elements are arranged along the mounting direction on the at least one lateral mounting face.

10. The lighting device according to claim 1, wherein the support structure comprises one metal core board forming the first layer and the second layer or two metal core boards respectively forming the first and the second layer.

11. The lighting device according to claim 1, wherein
the first layer comprises a dielectric insulating layer and a conductive contact layer; and
the plurality of second light emitting elements are electrically connected to the conductive contact layer.

12. The lighting device according to claim 1, wherein one of the plurality of first light emitting elements and one of the plurality of second light emitting elements are electrically connected in series.

13. The lighting device according to claim 1, wherein each of the first light emitting elements is in contact with two conductor segments from the first layer.

14. An automotive headlight comprising the lighting device according to claim 1.

15. A method of manufacturing a lighting device according to claim 1, the method comprising:
providing the support structure comprising the first layer and the second layer;
forming the central mounting face by a portion of the first layer and by a portion of the second layer;
forming the at least one lateral mounting face by a portion of one of the first layer and the second layer;
arranging the at least one first light emitting element on the central mounting face in contact with the first layer and in contact with the second layer; and
arranging the at least one second light emitting element on the lateral mounting face in contact with the one of the first layer and the second layer forming the lateral mounting face, and separated from the other one of the first layer and the second layer.

\* \* \* \* \*